United States Patent
Orvis et al.

(10) Patent No.: US 7,636,446 B1
(45) Date of Patent: Dec. 22, 2009

(54) STATE MACHINE ENABLING AUTO-RECOVERY OF SHORT-CIRCUITED CLASS D AUDIO AMPLIFIERS

(75) Inventors: Skip T. Orvis, San Jose, CA (US); Daniel B. Freeman, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 948 days.

(21) Appl. No.: 10/969,103

(22) Filed: Oct. 19, 2004

Related U.S. Application Data

(60) Provisional application No. 60/612,342, filed on Sep. 22, 2004.

(51) Int. Cl.
*H03F 99/00* (2006.01)
(52) U.S. Cl. .......... 381/120; 381/55; 330/207 A; 330/251; 330/298
(58) Field of Classification Search ....... 381/94.1–94.8, 381/120, 59, 7, 123, 96, 111, 55; 330/251, 330/10, 207, 298, 207 A; 363/49–50
See application file for complete search history.

(56) References Cited

U.S. PATENT DOCUMENTS

| | | | | |
|---|---|---|---|---|
| 4,544,981 A | * | 10/1985 | Hakoopian | 361/93.7 |
| 4,978,926 A | * | 12/1990 | Zerod et al. | 330/279 |
| 5,568,342 A | * | 10/1996 | Tavazzani et al. | 361/18 |
| 5,815,584 A | * | 9/1998 | Whitecar et al. | 381/86 |
| 2002/0186573 A1 | * | 12/2002 | Quintanar et al. | 363/49 |
| 2004/0176955 A1 | * | 9/2004 | Farinelli et al. | 704/255 |
| 2004/0184627 A1 | * | 9/2004 | Kost et al. | 381/120 |

OTHER PUBLICATIONS

"TPA3008D2: 10-W Stereo Class-D Audio Power Amp", http://focus.ti.com/docs/prod/folders/print/tpa3008d2.html Texas Instruments, downloaded from Internet on Feb. 8, 2004 3 pages.
"TPA3004D2: 12-W Stereo Class-D Audio Power Amplifier With DC Volume Control", Texas Instruments Data Sheet, SLOS407C—Feb. 2003, Revised Jan. 2004, 40 pages.
Pauly, Donald E., "High Fidelity Switching Audio Amplifiers Using TMOS Power MOSFETs", ON Semiconductor Publication No. AN1042/D, Aug. 2002—Rev. 3, 12 pages.

\* cited by examiner

*Primary Examiner*—Vivian Chin
*Assistant Examiner*—Fatimat O Olaniran
(74) *Attorney, Agent, or Firm*—Beyer Law Group LLP

(57) ABSTRACT

Methods and apparatus for enabling auto-recovery of a digital audio amplifier after a short-circuit are disclosed. In accordance with one embodiment, a short-circuit is detected by both detecting a switching signal at an output of the digital audio amplifier and sensing a mute signal coupled to the digital audio amplifier. Once a short-circuit has been detected, a reset signal is provided to a reset input of the digital audio amplifier when the switching signal indicates that the digital audio amplifier is not switching and the mute signal indicates that the amplifier is in an un-muted state.

30 Claims, 4 Drawing Sheets

STATE MACHINE ENABLING AUTO-RECOVERY OF SHORT-CIRCUITED CLASS D AUDIO AMPLIFIERS

This application claims priority of U.S. provisional application No. 60/612,342 filed on Sep. 22, 2004 which is hereby incorporated by reference.

BACKGROUND OF THE INVENTION

1. Field of the Invention

The present invention relates to audio amplifiers and, more particularly, to auto-recovery of a digital audio amplifier after the occurrence of a short-circuit on the outputs of the digital audio amplifier.

2. Description of the Related Art

In order to operate a speaker, an audio amplifier is implemented. The audio amplifier may be an analog amplifier or a digital amplifier. In general, digital amplifiers are more desirable since they are generally more efficient in their power consumption than analog amplifiers.

While digital amplifiers are desirable for a variety of reasons, there are some disadvantages associated with their use. For instance, if a short circuit of the digital amplifier occurs, the amplifier may shut down until it has been reset. Specifically, when a computer (or processor) is connected to the amplifier, the computer may need to be restarted in order to reset the amplifier.

In view of the above, it would be beneficial if recovery from a short circuit could be accomplished without restarting the computer.

SUMMARY OF THE INVENTION

The present invention supports auto-recovery of a digital audio amplifier after the occurrence of a short-circuit condition. This is accomplished, in part, through detection of a short-circuit condition and automatic reset of the digital audio amplifier. In this manner, auto-recovery of the digital audio amplifier is accomplished.

In accordance with one aspect of the invention, methods and apparatus for enabling auto-recovery of a digital audio amplifier after a short-circuit are disclosed. In accordance with one embodiment, a short-circuit is detected by both detecting a switching signal at an output of the digital audio amplifier and sensing a mute signal coupled to the digital audio amplifier. Once a short-circuit has been detected, a reset signal is provided to a reset input of the digital audio amplifier when the switching signal indicates that the digital audio amplifier is not switching and the mute signal indicates that the amplifier is in an un-muted state.

In accordance with another aspect of the invention, apparatus for enabling auto-recovery of a digital audio amplifier after a short-circuit is disclosed. A switching detect mechanism is coupled to an output of the digital audio amplifier, the switching detect mechanism being configured to detect a switching signal at the output of the digital audio amplifier. The apparatus further includes a mute sensing mechanism coupled to a mute signal. A state machine coupled to the switching detect mechanism and the mute sensing mechanism provides a reset signal to a reset input of the digital audio amplifier when the switching detect mechanism senses that the output of the digital audio amplifier is not switching and the mute sensing mechanism detects that the mute signal indicates that the amplifier is in an un-muted state.

The invention can be implemented in numerous ways including as a method, system, device, apparatus, and computer readable medium. Several embodiments of the invention are discussed below.

The embodiments of the invention may be implemented software, hardware, or a combination of hardware and software. The invention can also be embodied as computer readable code on a computer readable medium. In addition, data structures disclosed are also part of the invention.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1-6. However, those skilled in the art will readily appreciate that the detailed description given herein with respect to these figures is for explanatory purposes as the invention extends beyond these limited embodiments.

The embodiments described below can be applied to a digital audio amplifier. In accordance with one embodiment, the digital audio amplifier is a class D audio amplifier such as that described below with reference to FIG. 5. However, the present invention may also be applied to other digital audio amplifiers.

Figure 1:
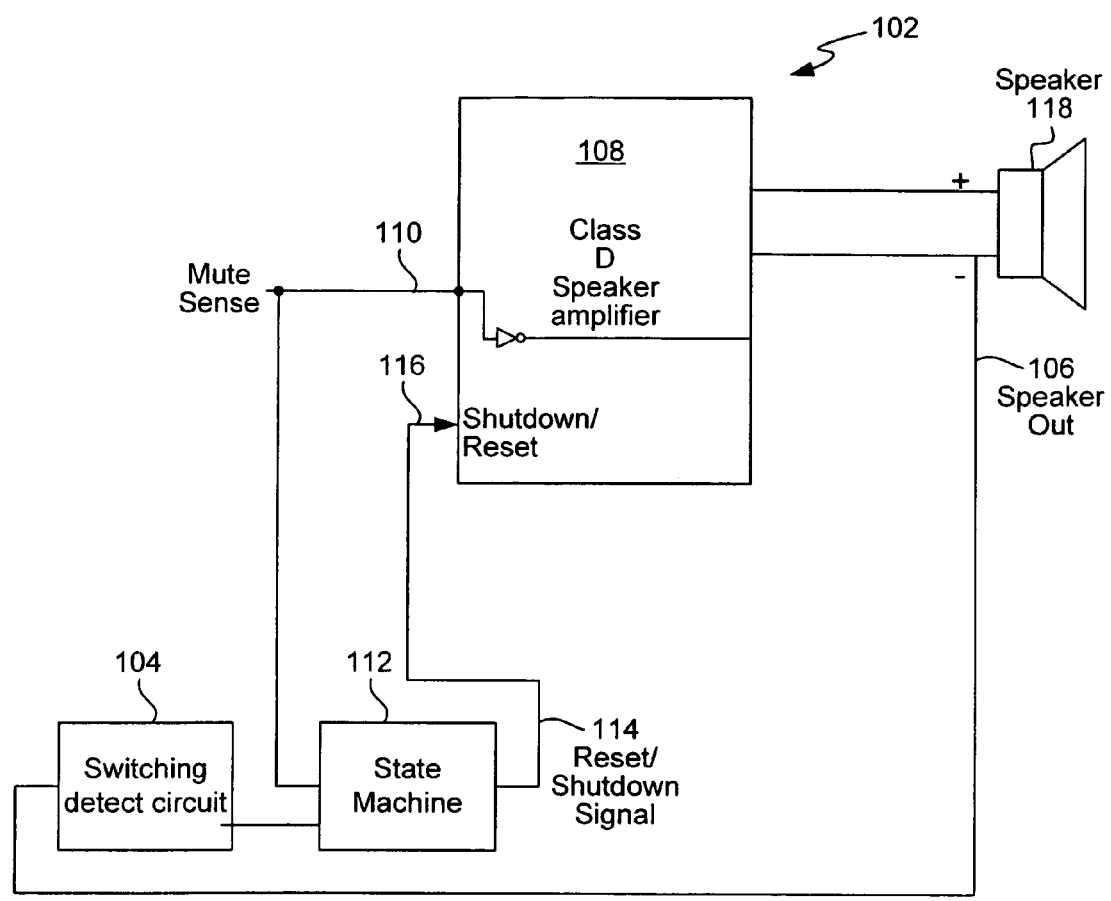
FIG. 1 is a block diagram illustrating a system in which the present invention may be implemented.

FIG. 1 is a block diagram illustrating a system in which the present invention may be implemented. As shown in FIG. 1, the system 102 includes a switching detect mechanism 104, which may include hardware and/or software. In this example, the switching detect mechanism 104 is a switching detect circuit. The switching detect circuit 104 is coupled to an output 106 of a class D audio amplifier 108, thereby enabling the switching detect circuit 104 to detect a switching signal at the output 106 of the class D audio amplifier 108.

The system 102 further includes a mute sensing mechanism 110 coupled to a mute signal. The mute sensing mechanism 110 may be implemented in hardware and/or software. A state machine 112 is coupled to the switching detect mechanism 104 and the mute sensing mechanism 110. The state machine 112 provides a reset signal 114 to a reset (i.e., shutdown) input 116 of the class D audio amplifier 108 when the switching detect mechanism 104 senses that the output 106 of the class D amplifier is not switching and the mute sensing mechanism 110 detects that the mute signal indicates that the amplifier 108 is in an un-muted state. The state machine 112 may be implemented in hardware and/or software.

The output(s) of the class D audio amplifier 108 is further coupled to one or more speakers 118. In this manner, the system 102 may be used to detect a short-circuit of the class D audio amplifier 108 as well as the speaker(s) 118. In other words, when the switching detect mechanism 104 detects that the output 106 of the class D audio amplifier 108 is not switching and the mute sensing mechanism 110 detects that the mute signal indicates that the amplifier 108 is in an un-muted state, a short-circuit in the speaker is detected. From this detection, auto-recovery is performed without requiring a shutdown of an associated computer system.

Figure 2:
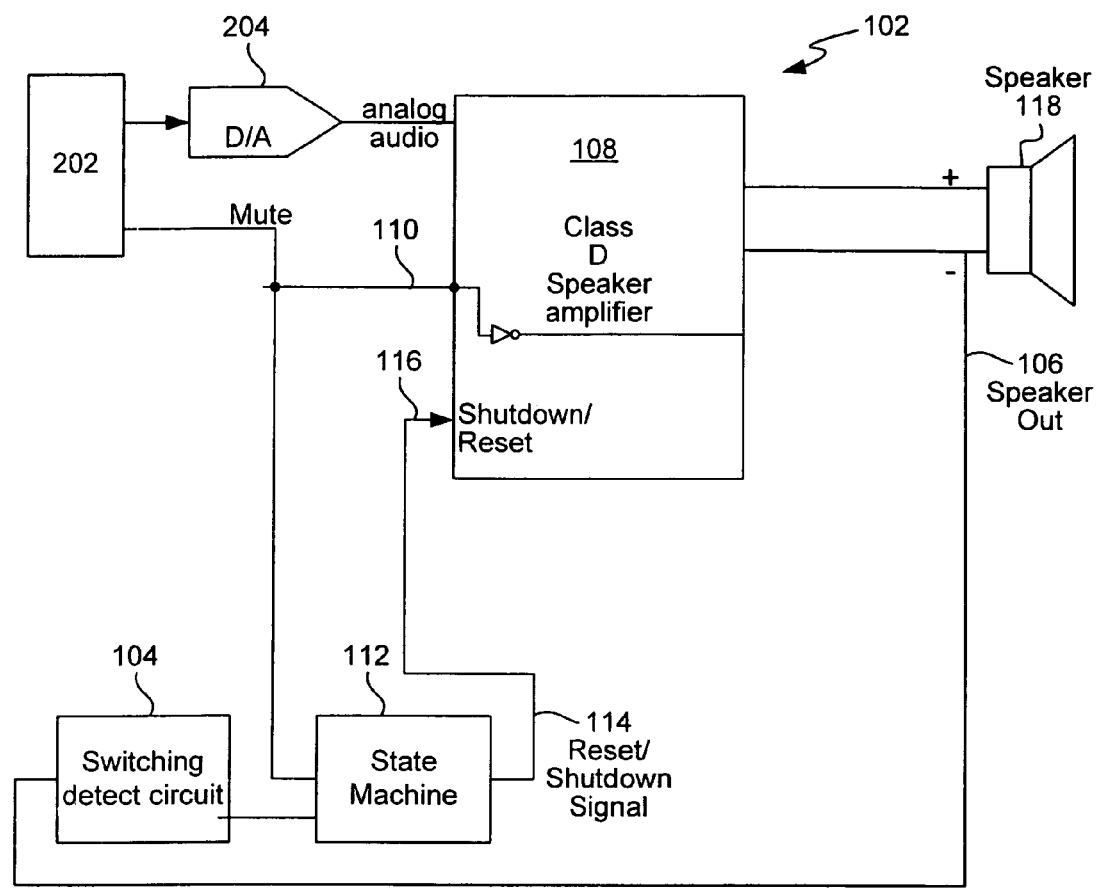
FIG. 2 is a block diagram illustrating an auto-recovery system in accordance with one embodiment of the invention.

FIG. 2 is a block diagram illustrating an auto-recovery system in accordance with one embodiment of the invention. In this example, a set of audio signals (e.g., digital audio signals) is produced by a microprocessor or suitable computer system 202 implementing software for generating audio signal(s) as well as muting those audio signal(s). Alternatively, a suitable circuit or combination of hardware and software may produce the set of audio signals and mute signal. The mute signal 110 is provided to a mute input of the class D audio amplifier 108, as shown. In addition, the set of digital audio signals is provided to a digital-to-analog converter 204, which provides the analog audio signal(s) to an audio input of the class D audio amplifier 108.

Figures 3, 4:
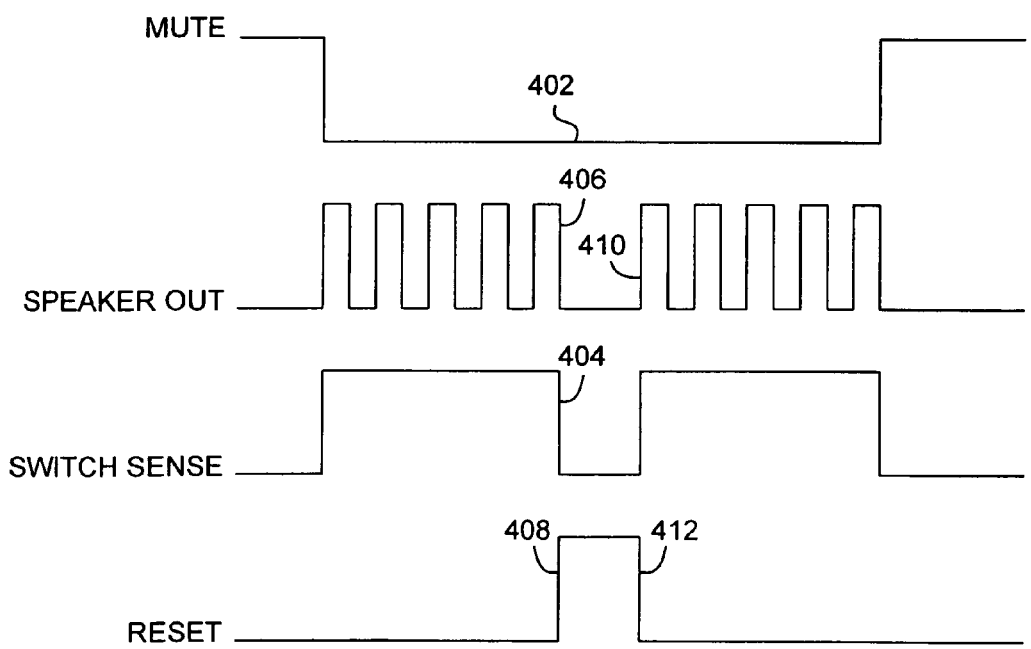
FIG. 3 is a table illustrating the operation of the state machine of the system in accordance with one embodiment of the invention.
FIG. 4 is a timing diagram illustrating operation of the auto-recovery system in accordance with one embodiment of the invention.

FIG. 3 is a table illustrating the operation of the state machine of the system in accordance with one embodiment of the invention. As shown, the state machine provides switching detect mechanism detects that the output of the class D audio amplifier is not switching and the mute sensing mechanism detects that the mute signal indicates that the amplifier is in an un-muted state. In all other instances, the state machine provides a reset signal of logic zero at the reset input of the class D audio amplifier. The output of the class D audio amplifier is a logic zero when the audio amplifier is not switching and the switching signal at the output of the class D audio amplifier is a logic one when the audio amplifier is switching. In addition, the mute signal is a logic zero when the amplifier is in an un-muted state and is a logic one when the amplifier is in a muted state.

As described above, the state machine provides a reset signal to the reset input of the class D audio amplifier when the short-circuit has been detected. This reset signal may be provided for a specified period of time (e.g., number of seconds) and/or periodically. In addition, the reset signal may be provided until the switching detect mechanism detects that the output of the class D audio amplifier is switching. In other words, the reset signal is no longer necessary when recovery from the short-circuit condition has been successful.

FIG. 4 is a timing diagram illustrating operation of the auto-recovery system in accordance with one embodiment of the invention. As described above, when the mute signal is a logic zero 402 indicating that the amplifier is in an un-muted state and the output 404 of the amplifier is a logic zero indicating that the amplifier is not switching, a short-circuit has been detected, which is illustrated by the absence of a signal at the output of the audio amplifier 404 and at the speaker output 406. In order to recover from the short-circuit condition, the reset signal is set to a logic one at 408. Upon detection of a switching signal at the output of the amplifier at 410, the reset signal may be set to a logic zero at 412. Specifically, when either the mute signal and/or the output of the amplifier is a logic one, recovery is unnecessary or no longer necessary, and the reset signal is set to a logic zero.

Figure 5:
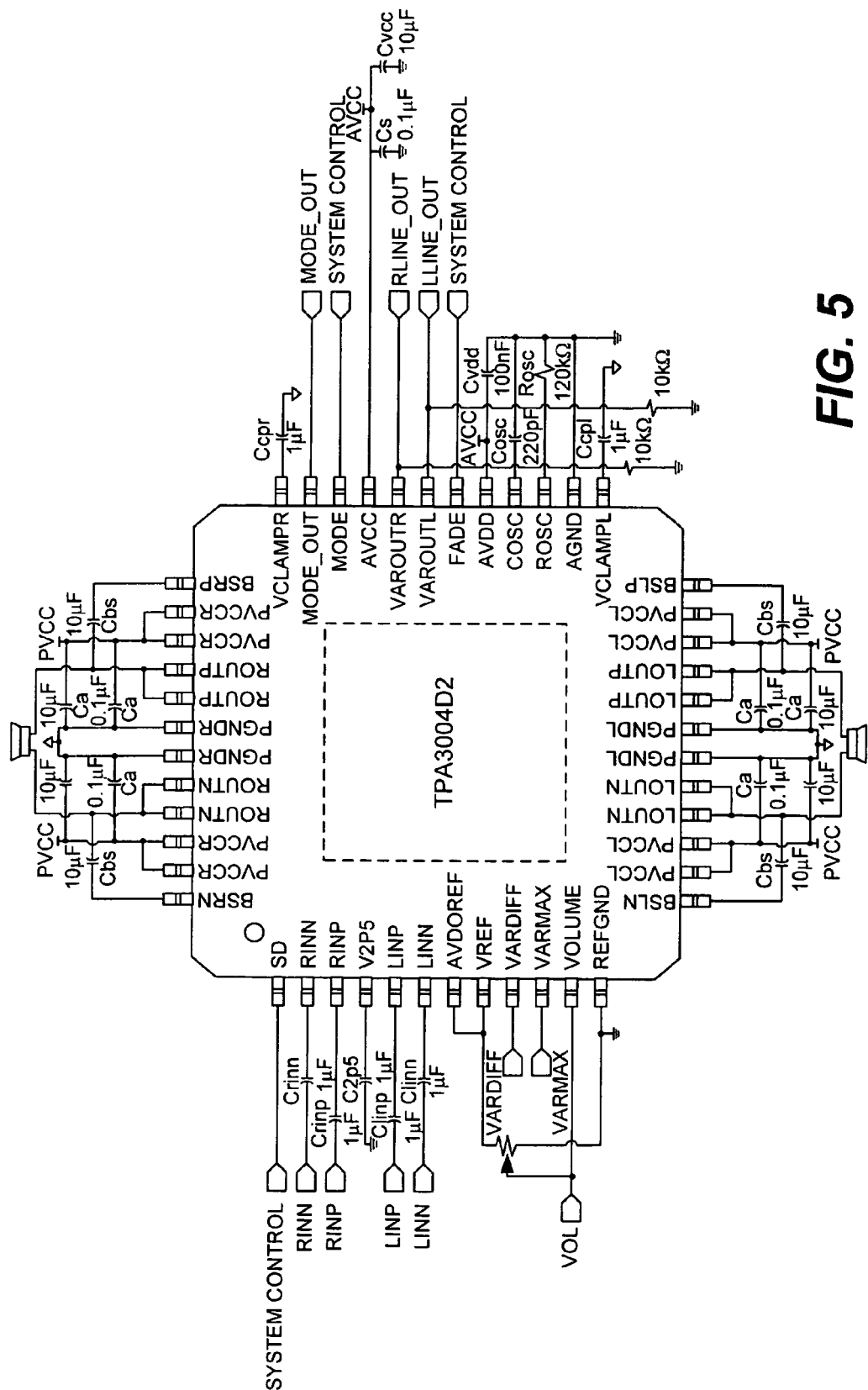
FIG. 5 is a block diagram illustrating an exemplary class D audio amplifier that may be used in accordance with one embodiment of the invention.

FIG. 5 is a block diagram illustrating an exemplary class D (switch mode) audio amplifier that may be used in accordance with one embodiment of the invention. As portable electronics consumers demand smaller devices with longer battery life, circuit designers are looking to replace conventional linear amplifiers with high-efficiency devices. Generally, a class D audio amplifier offers high quality audio with improved efficiency when compared to traditional linear audio amplifiers (Class A, Class B, and Class AB). Specifically, Class D (switch-mode) amplifiers provide a balance between efficiency and distortion required by portable electronic devices.

The Class D amplifier illustrated in FIG. 5 is Model TPA3004D2, available from Texas Instruments Incorporated. Model TPA3004D2 is a 12-W per channel efficient, Class-D audio amplifier, which may be used for driving bridged-tied stereo speakers. Specifically, external speakers including Class-D audio amplifiers are connected to a computer by a cable with a plug. When the plug on the speaker cable is inserted into the speaker jack on the computer, the class D audio amplifier may experience a short-circuit during the plug insertion until the plug is fully inserted.

As described above, if a short circuit of the digital amplifier occurs, the amplifier may shut down until it has been reset. Specifically, when a computer (or processor) is connected to the amplifier, the computer may need to be restarted in order to reset the amplifier. Through the disclosed embodiments, recovery from a short circuit may be accomplished without restarting the computer. Accordingly, the described embodiments support automatic recovery of a short-circuited Class D audio amplifier.

As described above, the system may be implemented in software, hardware, or a combination of hardware and software. Moreover, each of the components of the system may be implemented in software, hardware, or a combination of hardware and software. For those components implemented in software, a processor or computer system may be used to implement those components.

Although the apparatus of emphasis in several of the above embodiments described above are described as including class-D audio amplifiers, it should be understood that the amplifiers and associated system are not limited to class-D audio amplifiers, but may be applicable to other audio amplifiers such as other digital audio amplifiers. Moreover, the various aspects, embodiments, implementations or features of the invention can be used separately or in any combination.

The invention can be implemented in hardware, software or a combination of hardware and software. The invention can also be embodied as computer readable code on a computer readable medium. The computer readable medium is any data storage device that can store data, which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The advantages of the invention are numerous. Different aspects, embodiments or implementations may yield one or more of the following advantages. One advantage of the invention is that recovery from a short-circuit may be accomplished without re-starting an associated processor or computer system. Another advantage of the invention is that recovery may be automatically accomplished without user interaction.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method of enabling auto-recovery of a class D audio amplifier after a short-circuit, comprising: sensing a switching signal at an output of the class D audio amplifier; sensing a mute signal coupled to the class D audio amplifier and the mute signal coupled to a digital computing device in a powered-on state and operatively connected to the class D audio amplifier;

detecting a short-circuit in the class D audio amplifier when the switching signal indicates that the class D audio amplifier is not switching and the mute signal indicates that the class D amplifier is in an un-muted state;

and providing a reset signal to a reset input of the class D audio amplifier without powering down the digital computing device when the short-circuit is detected in the class D audio amplifier, thereby recovering from the short-circuit without powering down the digital computing device.

2. The method as recited in claim 1, wherein detecting a switching signal comprises:

detecting that the switching signal at the output of the class D audio amplifier is a logic zero when the audio amplifier is not switching; and detecting that the switching signal at the output of the class D audio amplifier is a logic one when the audio amplifier is switching.

3. The method as recited in claim 2, wherein sensing a mute signal comprises:

detecting that the class D audio amplifier is in an un-muted state when the mute signal is a logic zero; and detecting that the class D audio amplifier is in a muted state when the mute signal is a logic one.

4. The method as recited in claim 3, wherein providing a reset signal comprises:

providing a reset signal of logic one at the reset input of the class D audio amplifier when the switching signal indicates that the class D audio amplifier is not switching and the mute signal indicates that the amplifier is in an un-muted state; and otherwise providing a reset signal of logic zero at the reset input of the class D audio amplifier.

5. The method as recited in claim 1, wherein sensing a mute signal comprises:

detecting that the class D audio amplifier is in an un-muted state when the mute signal is a logic zero; and detecting that the class D audio amplifier is in a muted state when the mute signal is a logic one.

6. The method as recited in claim 1, wherein providing a reset signal comprises:

providing a reset signal of logic one at the reset input of the class D audio amplifier when the switching signal indicates that the class D audio amplifier is not switching and the mute signal indicates that the amplifier is in an un-muted state; and otherwise providing a reset signal of logic zero at the reset input of the class D audio amplifier.

7. The method as recited in claim 1, wherein when the switching signal indicates that the class D audio amplifier is not switching and the mute signal indicates that the amplifier is in an un-muted state, a short-circuit in the class D audio amplifier is detected.

8. The method as recited in claim 1, wherein providing the reset signal is performed until the switching signal indicates that the class D audio amplifier is switching.

9. The method as recited in claim 1, wherein providing the reset signal is performed at least one of periodically and for a specified period of time.

10. An apparatus for enabling auto-recovery of a class D audio amplifier after a short-circuit, comprising:

a switching detect mechanism coupled to an output of the class D audio amplifier, the switching detect mechanism being configured to detect a switching signal at the output of the class D audio amplifier;

a mute sensing mechanism coupled to a mute signal; and a state machine coupled to the switching detect mechanism and the mute sensing mechanism, the state machine operable to:

detect a short-circuit in the class D audio amplifier when the switching detect mechanism senses that the output of the class D audio amplifier is not switching and the mute sensing mechanism detects that the mute signal indicates that the amplifier is in an un-muted state, and provide a reset signal to reset an input of the class D audio amplifier when the state machine detects the short-circuit in the class D audio amplifier.

11. The apparatus as recited in claim 10, wherein the apparatus is implemented in at least one of hardware and software.

12. The apparatus as recited in claim 10, wherein the switching detect mechanism detects that the switching signal at the output of the class D audio amplifier is a logic zero when the audio amplifier is not switching and detects that the switching signal at the output of the class D audio amplifier is a logic one when the audio amplifier is switching.

13. The apparatus as recited in claim 12, wherein the mute sensing mechanism detects that the amplifier is in an un-muted state when the mute signal is a logic zero and detects that the amplifier is in a muted state when the mute signal is a logic one.

14. The apparatus as recited in claim 13, wherein the state machine provides a reset signal of logic one at the reset input of the class D audio amplifier when the switching detect mechanism detects that the output of the class D audio amplifier is not switching and the mute sensing mechanism detects that the mute signal indicates that the amplifier is in an un-muted state, and otherwise provides a reset signal of logic zero at the reset input of the class D audio amplifier.

15. The apparatus as recited in claim 10, wherein the mute sensing mechanism detects that the amplifier is in an un-muted state when the mute signal is a logic zero and detects that the amplifier is in a muted state when the mute signal is a logic one.

16. The apparatus as recited in claim 10, wherein the state machine provides a reset signal of logic one at the reset input of the class D audio amplifier when the switching detect mechanism senses that the output of the class D audio amplifier is not switching and the mute sensing mechanism detects that the mute signal indicates that the amplifier is in an un-muted state, and otherwise provides a reset signal of logic zero at the reset input of the class D audio amplifier.

17. The apparatus as recited in claim 10, the class D audio amplifier further including an audio input and a mute input, the audio input configured to receive an audio signal and the mute input being coupled to the mute signal.

18. The apparatus as recited in claim 17, wherein the audio input is configured to receive an analog audio signal, the audio input being coupled to an output of a digital-to-analog converter.

19. The apparatus as recited in claim 10, further comprising:
   a speaker being coupled to the output of the class D audio amplifier.

20. The apparatus as recited in claim 10, wherein the state machine provides a reset signal to the reset input of the class D audio amplifier for a specified period of time when the switching detect mechanism senses that the output of the class D audio amplifier is not switching.

21. The apparatus as recited in claim 10, wherein the state machine provides a reset signal to the reset input of the class D audio amplifier periodically for a specified period of time when the switching detect mechanism senses that the output of the class D audio amplifier is not switching.

22. The apparatus as recited in claim 10, wherein the state machine provides a reset signal to the reset input of the class D audio amplifier when the switching detect mechanism detects that the output of the class D audio amplifier is not switching until the switching detect mechanism senses that the output of the class D audio amplifier is switching.

23. The apparatus as recited in claim 22, wherein the state machine provides the reset signal to the reset input of the class D audio amplifier periodically.

24. The apparatus as recited in claim 22, wherein the state machine provides the reset signal to the reset input of the class D audio amplifier over a specified period of time.

25. The apparatus as recited in claim 19, wherein when the switching detect mechanism detects that the output of the class D audio amplifier is not switching and the mute sensing mechanism detects that the mute signal indicates that the amplifier is in an un-muted state, a short-circuit in the speaker is detected.

26. The apparatus as recited in claim 10, further comprising:
   a mechanism for providing the mute signal to the class D audio amplifier; and
   a mechanism for providing an analog audio signal to the class D audio amplifier.

27. The apparatus as recited in claim 26, wherein the mechanism for providing an analog audio signal to the class D audio amplifier includes a digital-to-analog converter.

28. The method as recited in claim 1, wherein detecting, sensing and providing are performed in accordance with a state machine.

29. A method of enabling auto-recovery of a digital audio amplifier after a short-circuit, comprising: detecting a switching signal at an output of the digital audio amplifier; sensing a mute signal coupled to the digital audio amplifier; detecting a short-circuit in the digital audio amplifier when the switching signal indicates that the class D audio amplifier is not switching and the mute signal indicates that the class D amplifier is in an un-muted state: and providing a reset signal to a reset input of the digital audio amplifier when the short-circuit is detected in the digital audio amplifier.

30. An apparatus for enabling auto-recovery of a digital audio amplifier after a short-circuit, comprising:
   means for detecting a switching signal at an output of the digital audio amplifier;
   means for sensing a mute signal coupled to the digital audio amplifier;
   means for detecting a short-circuit in the digital audio amplifier when the switching signal indicates that the class D audio amplifier is not switching and the mute signal indicates that the class D amplifier is in an un-muted state; and
   means for providing a reset signal to a reset input of the digital audio amplifier when the detecting means detects the short-circuit in the digital audio amplifier.

* * * * *

UNITED STATES PATENT AND TRADEMARK OFFICE
CERTIFICATE OF CORRECTION

PATENT NO. : 7,636,446 B1  Page 1 of 1
APPLICATION NO. : 10/969103
DATED : December 22, 2009
INVENTOR(S) : Orvis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1239 days.

Signed and Sealed this

Ninth Day of November, 2010

David J. Kappos
*Director of the United States Patent and Trademark Office*